(12) United States Patent
Kim

(10) Patent No.: US 9,653,506 B2
(45) Date of Patent: May 16, 2017

(54) IMAGE SENSOR AND METHOD FOR FABRICATING THE SAME

(71) Applicant: SK hynix Inc., Gyeonggi-do (KR)

(72) Inventor: Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/453,258

(22) Filed: Aug. 6, 2014

(65) Prior Publication Data

US 2015/0214262 A1 Jul. 30, 2015

(30) Foreign Application Priority Data

Jan. 28, 2014 (KR) ........................ 10-2014-0010538

(51) Int. Cl.
*H01L 27/146* (2006.01)
*H01L 21/14* (2006.01)
*H01L 31/0232* (2014.01)

(52) U.S. Cl.
CPC .. *H01L 27/14627* (2013.01); *H01L 27/14621* (2013.01); *H01L 27/14685* (2013.01)

(58) Field of Classification Search
CPC .............. H01L 31/101; H01L 31/0232; H01L 31/02162; H01L 27/146; H01L 27/14649; H01L 27/14627; H01L 27/14621; H01L 27/14601; H01L 27/14665; H01L 27/14685; H01L 27/307; H01L 31/18; H01L 21/00; H01L 21/76224; H01L 21/3086; H01L 27/1463; H01L 27/14636; H01L 27/14645; H01L 31/1884; H01L 31/153; H01L 31/022466

USPC ...... 438/42, 70; 257/292, E31.127, E31.001, 257/436, 432, E31.097; 250/214.1; 348/222.1, E05.031
See application file for complete search history.

(56) References Cited

U.S. PATENT DOCUMENTS

| | | | | |
|---|---|---|---|---|
| 7,745,247 B2 * | 6/2010 | Koizumi | ............. | H01L 27/1462 438/48 |
| 8,168,938 B2 | 5/2012 | Toda | | |
| 2008/0135897 A1 * | 6/2008 | Huang | ............. | H01L 27/14621 257/292 |
| 2010/0214432 A1 * | 8/2010 | Nakata | ............. | H01L 27/14627 348/222.1 |
| 2012/0012960 A1 * | 1/2012 | Yang | ................ | H01L 27/14627 257/432 |
| 2013/0037902 A1 * | 2/2013 | Nakazawa | ........ | H01L 27/14627 257/432 |

FOREIGN PATENT DOCUMENTS

KR 1020090050697 5/2009

* cited by examiner

*Primary Examiner* — Natalia Gondarenko
(74) *Attorney, Agent, or Firm* — IP & T Group LLP

(57) ABSTRACT

An image sensor includes a substrate including a photoelectric conversion region, an interlayer insulation layer including an interconnection line and formed on the substrate, a condensing pattern having a first refractive index and including a first region upwardly protruding from the interlayer insulation layer and a second region buried in the interlayer insulation layer, and a color filter formed on the condensing pattern to bury the condensing pattern.

19 Claims, 6 Drawing Sheets

IMAGE SENSOR AND METHOD FOR FABRICATING THE SAME

CROSS-REFERENCE TO RELATED APPLICATIONS

The present application claims priority of Korean Patent Application No. 10-2014-0010538, filed on Jan. 28, 2014, which is incorporated herein by reference in its entirety.

BACKGROUND

1. Field

Exemplary embodiments of the present invention relate to a semiconductor design technology, and more particularly, to an image sensor including a digital microlens and a method for fabricating the same.

2. Description of the Related Art

An image sensor is a semiconductor device which changes an optical image into an electrical signal. Image sensors include a plurality of pixels, which are arranged in a two-dimensional matrix. Each of the pixels includes a photoelectric conversion region which generates a photo-charge in response to incident light, and outputs a pixel signal corresponding to the incident light using the generated photo-charge.

Since the condensing (or concentrating) lens in conventional image sensors is curved, it has limited optical refraction efficiency. It has difficulty in applications where there is a large chief ray angle (CRA). To eliminate the above concerns, a novel digital microlens (DML) has been developed. The digital microlens concentrates light using a high refractive index layer and a low refractive index layer, and may be formed in a concavo-convex shape using a double pattern. However, the concavo-convex shape applied to a digital microlens may cause defective pixels due to its fabrication process.

SUMMARY

Exemplary embodiments of the present invention are directed to an image sensor for preventing a defect in a digital microlens and a method for fabricating the same.

In accordance with an exemplary embodiment of the present invention, an image sensor may include a substrate including a photoelectric conversion region, an interlayer insulation layer including an interconnection line and formed on the substrate, a condensing pattern having a first refractive index and including a first region upwardly protruding from the interlayer insulation layer and a second region buried in the interlayer insulation layer, and a color filter formed on the condensing pattern to bury the condensing pattern.

The first refractive index of the condensing pattern may be larger than a second refractive index of the color filter.

The condensing pattern may include a silicon nitride.

The first region of the condensing pattern may have a concavo-convex shape.

The second region of the condensing pattern may be disposed on an outer region of each pixel.

The second region of the condensing pattern may include a ring shape which surrounds each pixel.

In accordance with an exemplary embodiment of the present invention, a method for fabricating an image sensor may include forming an interlayer insulation layer including an interconnection line on a substrate having a photoelectric conversion region, forming a condensing pattern having a first refractive index and including a first region and a second region on the interlayer insulation layer, wherein the first region is formed on the interlayer insulation layer and the second region is buried in the interlayer insulation layer, and forming a color filter for covering the condensing pattern.

The forming of the condensing pattern may include forming a trench by selectively etching the interlayer insulation layer, forming a high refractive index layer for burying the trench, forming a mask pattern on the high refractive index layer, and forming the condensing pattern having the first refractive index by etching the high refractive index layer using the mask pattern as an etch barrier.

The first refractive index of the condensing pattern may be larger than a second refractive index of the color filter.

The condensing pattern may include a silicon nitride.

The second region of the condensing pattern may be disposed in an outer region of each pixel.

The second region of the condensing pattern may be formed in a ring shape to surround each pixel.

In accordance with an exemplary embodiment of the present invention, an image sensor having pixels may include a substrate including a photoelectric conversion region; an interlayer insulation layer including an interconnection line, wherein the interlayer insulation layer is formed on the substrate; a condensing pattern including a first region, having a first refractive index, and a second region, having a second refractive index, wherein the second region is at least partially buried in the interlayer insulation layer; and a color filter formed on the condensing pattern that buries the condensing pattern.

The first refractive index may be different than the second refractive index.

The first region may at least partially protrudes from the interlayer insulation layer.

The second region may form a concentric shape near or on the periphery of each pixel.

The first region may at least partially protrude from the interlayer insulation layer.

The second region may form a concentric shape near or on the periphery of each pixel.

The second region may form a concentric shape near or on the periphery of each pixel.

DETAILED DESCRIPTION

Figure 1:
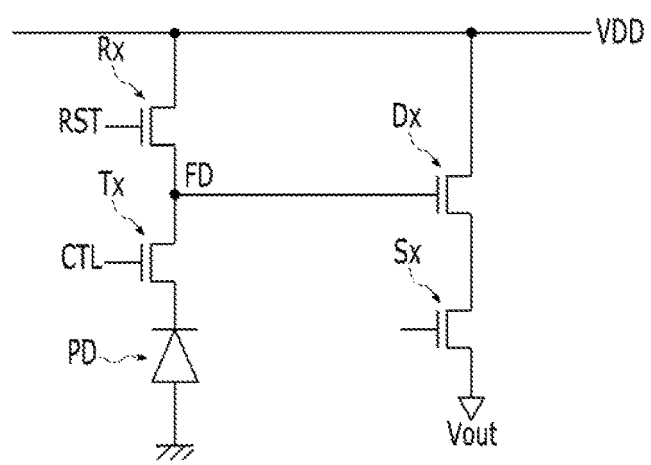
FIG. 1 is an equivalent circuit diagram illustrating an image sensor in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form, and vice versa, as long as it is not specifically mentioned. Furthermore, 'include/comprise' or 'including/comprising' used in the specification represents that one or more components, steps, operations, and elements may exist or may be added.

Figure 2:
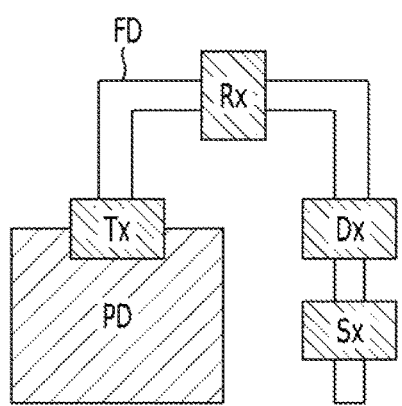
FIG. 2 is a plane diagram illustrating a pixel of an image sensor in accordance with an exemplary embodiment of the present invention.

FIG. 1 is an equivalent circuit diagram illustrating an image sensor in accordance with an exemplary embodiment of the present invention. FIG. 2 is a plane diagram illustrating a pixel of an image sensor in accordance with an exemplary embodiment of the present invention.

As shown in FIGS. 1 and 2, a pixel of an image sensor includes a photo diode PD, a transfer transistor Tx, a floating diffusion region FD, a reset transistor Rx, a drive transistor Dx and a selection transistor Sx.

The photo diode PD may be included in a photoelectric conversion region, which receives light and generates and accumulates a photo-charge.

The transfer transistor Tx transfers the photo-charge accumulated by the photo diode PD to the floating diffusion region FD in response to a transfer control signal CTL inputted through a gate thereof.

The floating diffusion region FD receives and stores the photo-charge transferred through the transfer transistor Tx.

The reset transistor Rx is coupled between a power supply voltage VDD terminal and the floating diffusion region FD. The reset transistor Rx resets the floating diffusion region FD by draining the photo-charge stored in the floating diffusion region FD with the power supply voltage VDD in response to a reset signal RST. The floating diffusion region FD may be electrically coupled to a drive gate of the drive transistor Dx.

The drive transistor Dx performs a function of a source follower-typed buffer amplifier and buffers a signal in response to the photo-charge stored in the floating diffusion region FD. The drive transistor Dx and the reset transistor Rx may be coupled in series.

The selection transistor Sx performs switching and addressing operations.

Figure 3A:
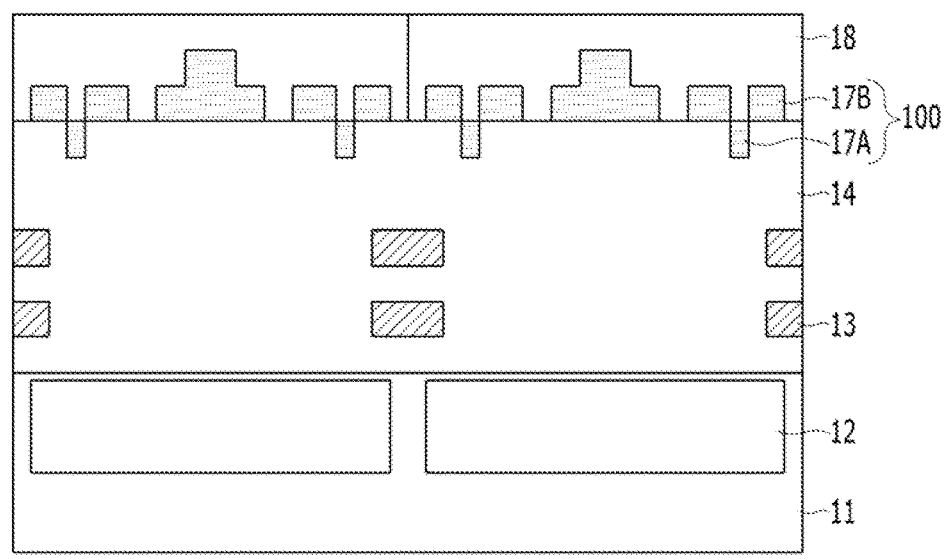
FIG. 3A is a cross sectional view illustrating an image sensor in accordance with an exemplary embodiment of the present invention.

FIG. 3A is a cross sectional view illustrating an image sensor in accordance with an exemplary embodiment of the present invention.

Figure 3B:
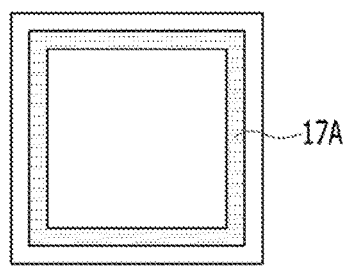
FIG. 3B is a plane diagram illustrating a high refractive index layer in accordance with an exemplary embodiment of the present invention.

FIG. 3B is a plane diagram illustrating a high refractive index layer in accordance with an exemplary embodiment of the present invention.

Referring to FIGS. 3A and 3B, an element isolation layer (not shown) for isolating neighboring pixels from a photoelectric conversion region 12 is formed in a substrate 11 having a plurality of pixels. An interlayer insulation layer 14 having a signal generating circuit 13 is formed on a front side of the substrate 11. A condensing pattern 100 having a concavo-convex shape is formed on the interlayer insulation layer 14. A color filter 18 is then formed on the condensing pattern 100.

The substrate 11 may include a semiconductor substrate. The semiconductor substrate may include a single crystal type of silicon containing material. For example, the substrate 11 may include a bulk silicon substrate or a silicon-on insulator (SOI) substrate.

The photoelectric conversion region 12 may include a plurality of photoelectric conversion units (not shown), which vertically overlap. Each of the plurality of photoelectric conversion units may include a photo diode having an N-type impurity region and a P-type impurity region. The photoelectric conversion region 12 may penetrate the substrate 11 to be flush with both a front side and a back side of the substrate 11 (i.e., at the same level). In another embodiment, the photoelectric conversion region 12 may be formed on a front side of the substrate 11 and separated from a back side of the substrate 11 (i.e., at different levels).

The interlayer insulation layer 14 may include at least one material selected from a group of an oxide, a nitride and an oxynitride. The signal generation circuit 13 formed in the interlayer insulation layer 14 may include a plurality of transistors (not shown), a multi-layer metal interconnection line (not shown) and a contact plug (not shown). The signal generation circuit 13 generates a pixel signal corresponding to a photo-charge generated in the photoelectric conversion region 12.

The condensing pattern 100 may include a first region 17B protruding from the interlayer insulation layer 14 and a second region 17A buried in the interlayer insulation layer 14. The condensing pattern 100 may include a high refractive index layer having a first refractive index larger than the refractive index of the color filter 18. The condensing pattern 100 may include a silicon nitride. The condensing pattern 100 may perform the function of a microlens.

The first region 17B and the second region 17A of the condensing pattern 100 may include the same material having the same refractive index. The first region 17B and the second region 17A of the condensing pattern 100 may be formed by the same process or different processes. Details of this process will be described later.

The second region 17A buried in the interlayer insulation layer 14 may be formed on an outer region of each pixel and may be formed in a ring shape to surround the each pixel. In another embodiment of the present invention, the second region 17A may be formed in a bar shape or an island shape, and may be formed in a central region of each pixel. Details will be described with reference to FIGS. 5 to 7.

The color filter 18 may be formed to correspond to the photoelectric conversion region 12. For example, the color filter 18 may be formed to be corresponding to a red, green, or blue pixel of the photoelectric conversion region 12. If an image sensor includes an infrared photoelectric conversion region (or conversion region for other electromagnetic waves, for example x-rays), an infrared filter (or other electromagnetic filter) may be formed to correspond to an infrared receiving element.

The color filter 18 covers the condensing pattern 100 and has a thickness suitable to planarize the image sensor. The color filter 18 buried in the condensing pattern 100 may perform the function of a microlens having a second refractive index smaller than the first refractive index.

The color filter 18 having a planar surface is formed in an embodiment of the present invention, but a color filter having other shapes may be formed in another embodiment of the present invention.

As described above, the refractive index of the condensing pattern 100 may be adjusted based on the wavelength of incident light and to maximize concentrating efficiency by having the first region 17B upwardly protruding from the interlayer insulation layer 14 and the second region 17A buried in the interlayer insulation layer 14. That is, the condensing pattern 100 may concentrate light without image distortion even with incident light at wide angles. Moreover, the image sensor in accordance with an embodiment of the present invention prevents particle defects by forming the color filter 18 on top of the condensing pattern 100 having a concavo-convex shape and planarizing the surface of the image sensor without an additional process.

FIGS. 4A to 4E are cross sectional views illustrating an image sensor in accordance with an exemplary embodiment of the present invention. That is, FIGS. 4A to 4E are cross sectional views illustrating a method for fabricating an image sensor shown in FIG. 3. The same numerals are used in FIG. 4A to 4E.

Figure 4A:
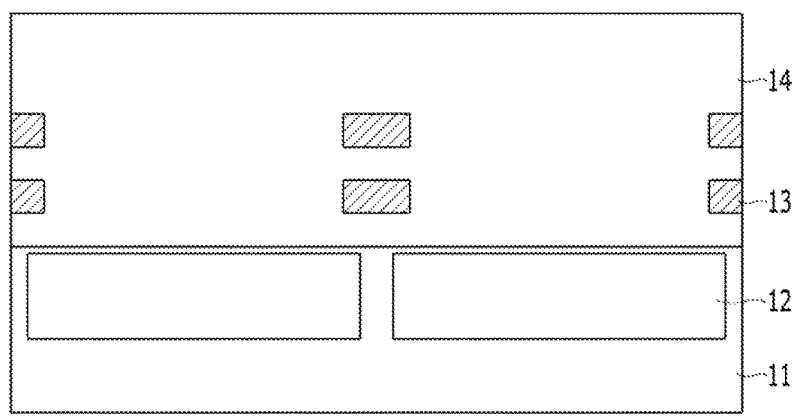
FIGS. 4A to 4E are cross sectional views illustrating an image sensor in accordance with an exemplary embodiment of the present invention.

Referring to FIG. 4A, a substrate 11 having a plurality of pixels is prepared. The substrate 11 may include a semiconductor substrate. The semiconductor substrate may include a silicon containing material having a single crystal state. For example, the substrate 11 may include a bulk silicon substrate or a silicon-on insulator (SOI) substrate.

Subsequently, an element isolation region (not shown) may be formed along a border region of the plurality of pixels in the substrate 11. The element isolation region may have an element isolation trench in the substrate 11, and may be formed by a shallow trench isolation (STI) process for gap-filling an insulation material in the element isolation trench.

Subsequently, the photoelectric conversion region 12 may be formed in the substrate 12. The photoelectric conversion region 12 may include a plurality of photoelectric conversion units (not shown), which are vertically overlapped. Each of the plurality of photoelectric conversion units may include a photo diode having an N-type impurity region and a P-type impurity region. The photo diode may be formed by an impurity ion injection process.

Next, the interlayer insulation layer 14 having the signal generation circuit 13 may be formed on the front side of the substrate 11. The interlayer insulation layer 14 may include at least one material selected from a group of an oxide, a nitride and an oxynitride. The signal generation circuit 13 generates a pixel signal or an electrical signal corresponding to a photo-charge generated in the photoelectric conversion region 12. The signal generation circuit 13 formed in the interlayer insulation layer 14 may include a plurality of transistors (not shown). The plurality of transistors may include a transfer transistor, a selection transistor, a reset transistor and an access transistor.

Figure 4B:
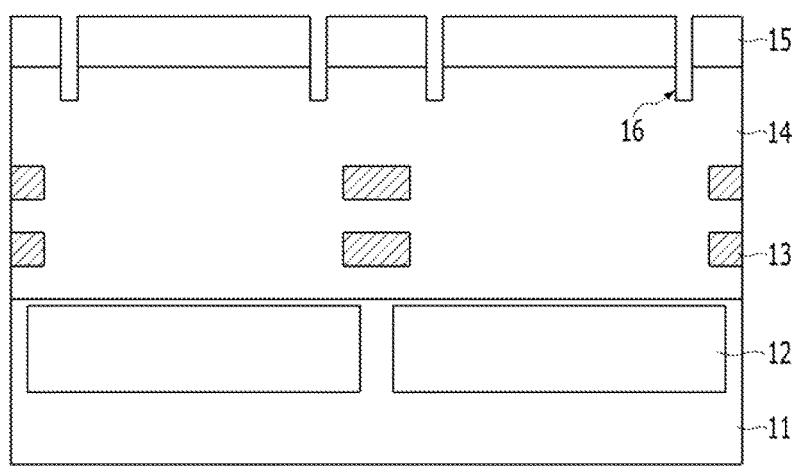

Referring to FIG. 4B, a trench 16 may be formed in the interlayer insulation layer 14. The trench 16 may be formed by forming a first mask pattern 15 on the interlayer insulation layer 14 and etching the interlayer insulation layer 14 using the first mask pattern 15 as an etch barrier. The shape and a disposition of the trench 16 may be changed to suit the desired second region 17A of the condensing pattern 100.

Figure 4C:
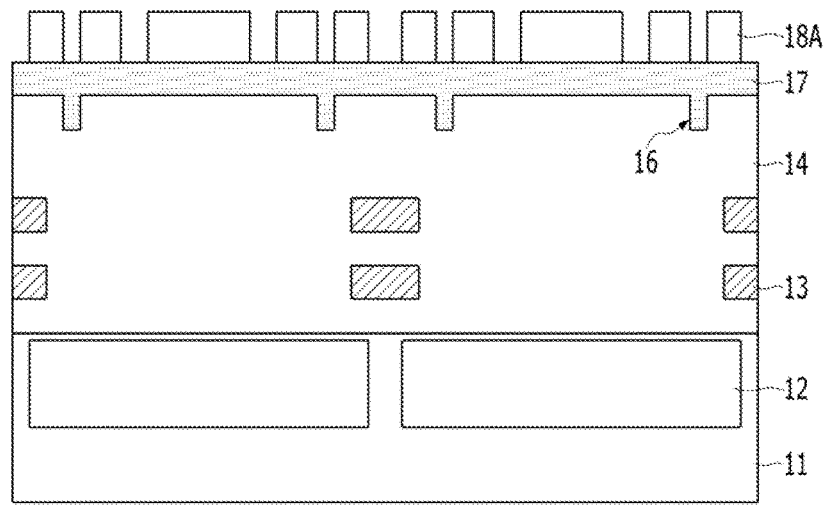

Referring to FIG. 4C, the high refractive index layer 17 which buries the trench 16 is formed on the interlayer insulation layer 14. Before the high refractive index layer 17 is formed, the first mask pattern 15 used for forming the trench 16 may be removed.

The high refractive index layer 17 may include a material having a first refractive index larger than the refractive index of the color filter 18 and air. The high refractive index layer 17 may include a silicon nitride.

Subsequently, a second mask pattern 18A is formed on the high refractive index layer 17. The second mask pattern 18A is used for forming the condensing pattern 100 by etching the high refractive index layer 17. The second mask pattern 18A may have a high etch selectivity ratio relative to the interlayer insulation layer 14.

Figure 4D:
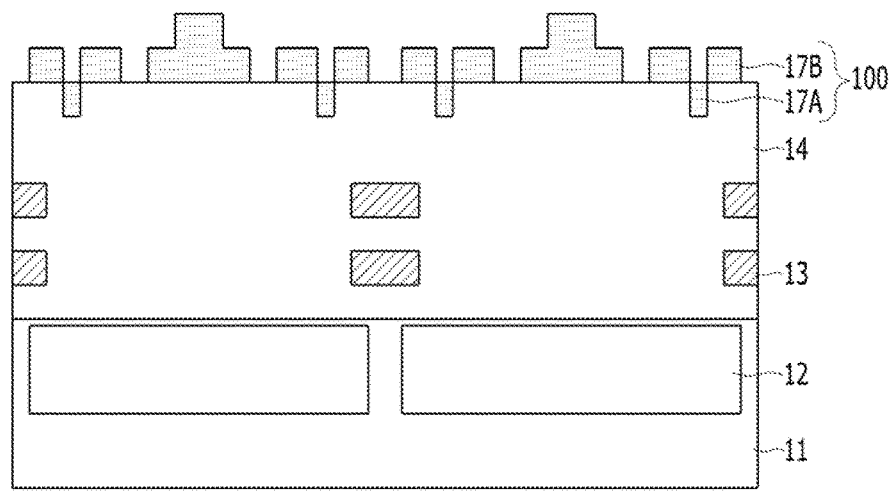

Referring to FIG. 4D, the condensing pattern 100 having the first region 17B protruding from the interlayer insulation layer 14 and the second region 17A buried in the interlayer insulation layer 14 is formed by etching the high refractive index layer 17.

After the second region 17A buried in the interlayer insulation layer 14 is formed, the first region 17B protruding from the interlayer insulation layer 14 may be additionally formed by repeatedly performing a deposition process and an etch process of the high refractive index layer. In another embodiment of the present invention, the second region 17A buried in the interlayer insulation layer 14 and the first region 17B protruding from the interlayer insulation layer 14 may be simultaneously formed through the etch process. In another embodiment of the present invention, the deposition process and the etch process of the high refractive index layer may be repeatedly performed such that the first region 17B protruding from the interlayer insulation layer 14 is formed to have a concavo-convex shape.

In an exemplary embodiment of the present invention, the condensing pattern 100 includes the second region 17A which is formed on the outer region of each pixel. However, in another embodiment of the present invention, the condensing pattern 100 is not limited to this and may be formed in various shapes as shown in FIG. 5 to 7.

Figure 4E:
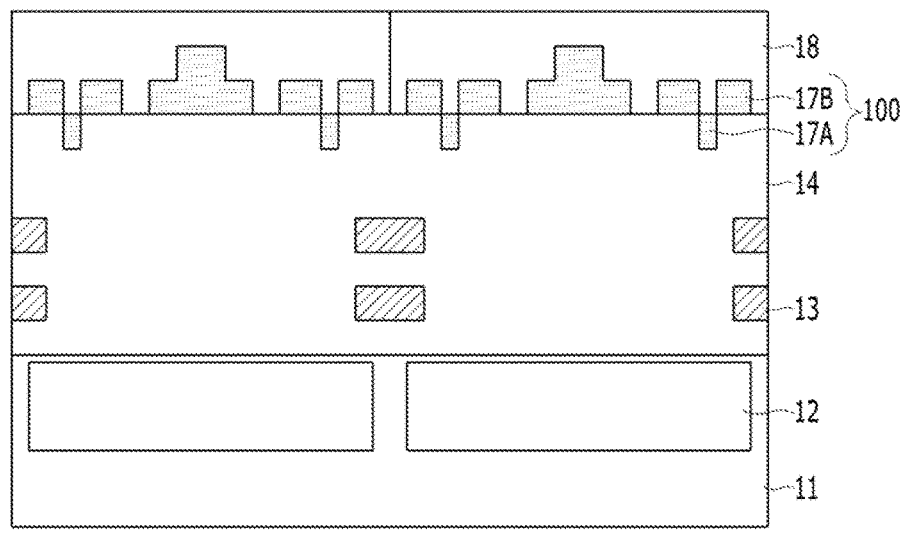

Referring to FIG. 4E, the color filter 18 is formed on the condensing pattern 100 so that the condensing pattern 100 is buried and planarized. The color filter 18 may include a filter corresponding to the photoelectric conversion region 12. The color filter 18 which buries the condensing pattern 100 may perform the function of a microlens and may have a second refractive index lower than a first refractive index. The color filter 18 may planarize the surface of the image sensor by burying the condensing pattern having the concavo-convex shape.

In an exemplary embodiment of the present invention, the color filter 18 has planar surface. However, in another embodiment of the present invention, the surface reflection may be reduced by forming a color filter 18 with a different surface shape through an exposure and a development process using a grid mask. Then, the image sensor may be completed using a published fabrication method.

Figure 5:
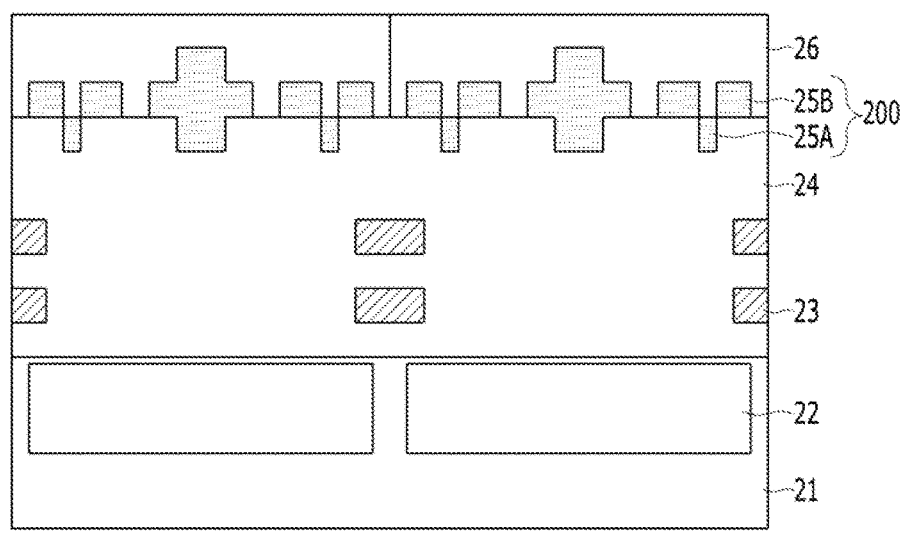
FIGS. 5 to 7 are cross sectional views illustrating an image sensor in accordance with another exemplary embodiment of the present invention.
Figure 6:
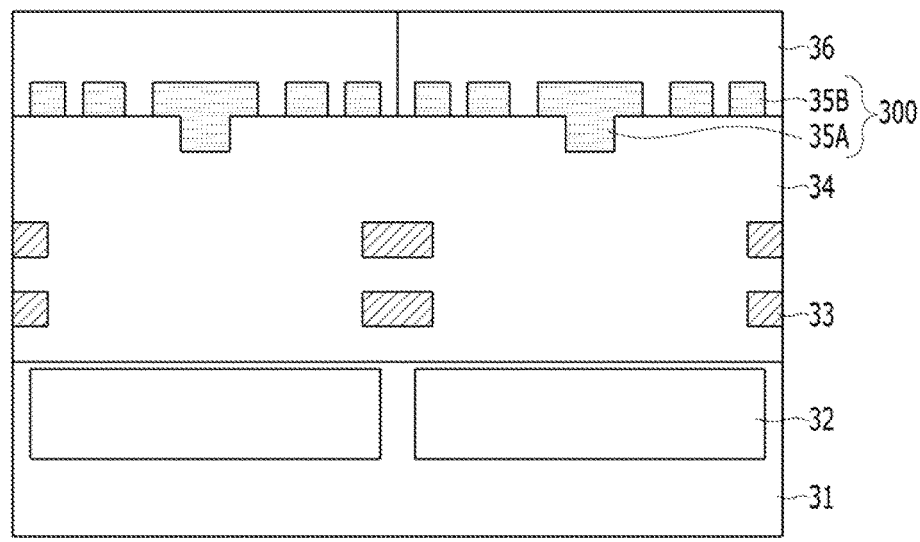
Figure 7:
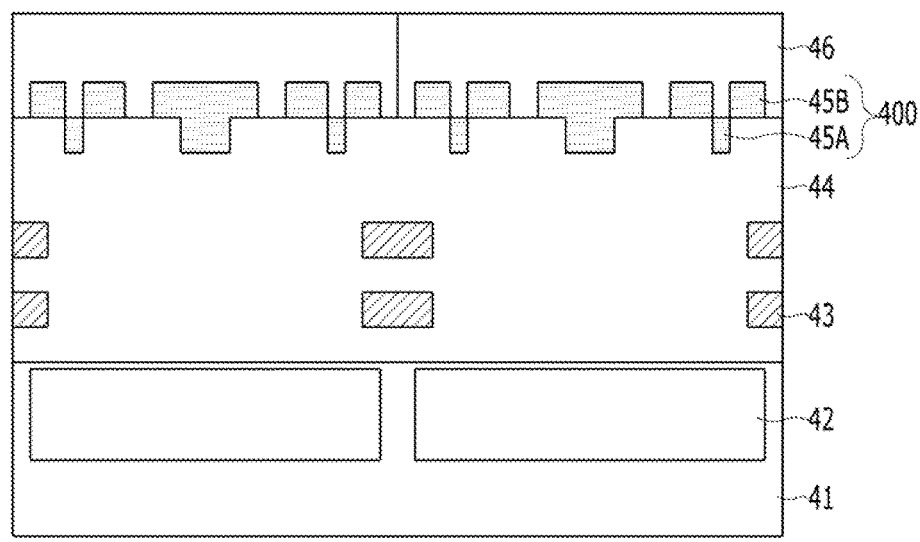

FIGS. 5 to 7 are cross sectional views illustrating an image sensor in accordance with another exemplary embodiment of the present invention.

Referring to FIG. 5, a second region 25A of a condensing pattern 200 may be formed in a center region and an outer region of each pixel.

Referring to FIG. 6, a second region 35A of a condensing pattern 300 may be formed in only a center region of each pixel. The height of the first region 358 formed on the interlayer insulation layer 34 may be reduced.

Referring to FIG. 7, a second region 45A of a condensing pattern 400 may be formed in a center region and an outer region of each pixel. The height of a first region 45B formed on an interlayer insulation layer 44 may be reduced.

In another embodiment of the present invention, the position and height of the first region and a second region of the condensing pattern may be changed.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
    a substrate including a photoelectric conversion region;
    an interlayer insulation layer including an interconnection line and formed on the substrate;
    a condensing pattern having a first refractive index, and including a first region and a second region, wherein each of the first region and the second region concentrates light, wherein the first region is upwardly protruding from the interlayer insulation layer and the second region is buried in the interlayer insulation layer; and
    a color filter formed on the first region and the second region of the condensing pattern to be directly contacted with the first region and the second region of the condensing pattern,
    wherein the color filter covers an entire surface of the first region and the second region of the condensing pattern,
    wherein the first region of the condensing pattern is not overlapped with the second region of the condensing pattern, and
    wherein a top surface of the second region of the condensing pattern has a same level as a bottom surface of the first region of the condensing pattern.

2. The image sensor of claim 1, wherein the first refractive index of the condensing pattern is larger than a second refractive index of the color filter.

3. The image sensor of claim 1, wherein the condensing pattern includes a silicon nitride.

4. The image sensor of claim 1, wherein the first region of the condensing pattern has a convex shape.

5. The image sensor of claim 1, wherein the second region of the condensing pattern is disposed on an outer region of each pixel.

6. The image sensor of claim 1, wherein the second region of the condensing pattern is in the shape of a ring that surrounds each pixel.

7. An image sensor having pixels, comprising:
    a substrate including a photoelectric conversion region;
    an interlayer insulation layer including an interconnection line, wherein the interlayer insulation layer is formed on the substrate;
    a condensing pattern including a first region and a second region, wherein each of the first region and the second region concentrates light, wherein the first region has a first refractive index, and the second region has a second refractive index and is at least partially buried in the interlayer insulation layer; and
    a color filter formed on the first region and the second region of the condensing pattern to be directly contacted with the first region and the second region of the condensing pattern,
    wherein the color filter covers an entire surface of the first region and the second region of the condensing pattern,
    wherein the first region of the condensing pattern is not overlapped with the second region of the condensing pattern, and
    wherein a top surface of the second region of the condensing pattern has a same level as a bottom surface of the first region of the condensing pattern.

8. The image sensor of claim 7, wherein the first refractive index is different than the second refractive index.

9. The image sensor of claim 7, wherein the first region at least partially protrudes from the interlayer insulation layer.

10. The image sensor of claim 7, wherein the second region forms a concentric shape on a periphery of each pixel.

11. The image sensor of claim 8, wherein the first region at least partially protrudes from the interlayer insulation layer.

12. The image sensor of claim 9, wherein the second region forms a concentric shape on a periphery of each pixel.

13. The image sensor of claim 8, wherein the second region forms a concentric shape on a periphery of each pixel.

14. An image sensor, comprising:
    a substrate including a photoelectric conversion region;
    an interlayer insulation layer including an interconnection line and formed on the substrate;
    a condensing pattern having a first refractive index, and including pluralities of first patterns and pluralities of second patterns, wherein each of the pluralities of first patterns and the pluralities of second patterns concentrates light; and
    a color filter formed on the pluralities of first patterns and the pluralities of second patterns of the condensing pattern to be directly contacted with the pluralities of first patterns and the pluralities of second patterns of the condensing pattern,
    wherein the color filter covers an entire surface of the pluralities of first patterns and the pluralities of second patterns of the condensing pattern,
    wherein the pluralities of first patterns are upwardly protruded from the interlayer insulation layer and are disposed to have intervals apart from each other,
    wherein each of the pluralities of second patterns is disposed under the intervals between the pluralities of first patterns and in the interlayer insulation layer, and
    wherein the pluralities of first patterns of the condensing pattern are not overlapped with the pluralities of the second patterns of the condensing pattern, and
    wherein a top surface of the pluralities of second patterns of the condensing pattern has a same level as a bottom surface of the pluralities of first patterns of the condensing pattern.

15. The image sensor of claim 14, wherein the first refractive index of the condensing pattern is larger than a second refractive index of the color filter.

16. The image sensor of claim 14, wherein the condensing pattern includes a silicon nitride.

17. The image sensor of claim 14, wherein the pluralities of first patterns of the condensing pattern have convex shapes.

18. The image sensor of claim 14, wherein the pluralities of second patterns of the condensing pattern are disposed on an outer region of each pixel.

19. The image sensor of claim 14, wherein the pluralities of second patterns of the condensing pattern are in the shape of a ring that surrounds each pixel.

* * * * *